(12) United States Patent
Sidhu et al.

(10) Patent No.: US 9,017,540 B2
(45) Date of Patent: Apr. 28, 2015

(54) SYSTEMS AND METHODS FOR REDUCING OVERHANG ON ELECTROPLATED SURFACES OF PRINTED CIRCUIT BOARDS

(75) Inventors: Rajwant S. Sidhu, Brea, CA (US); Ruben A. Zepeda, Yorba Linda, CA (US); Carlos A. Lopez, San Dimas, CA (US)

(73) Assignee: Viasystems Technologies Corp. L.L.C., St. Louis, MO (US)

( * ) Notice: Subject to any disclaimer, the term of this patent is extended or adjusted under 35 U.S.C. 154(b) by 555 days.

(21) Appl. No.: 13/162,408

(22) Filed: Jun. 16, 2011

(65) Prior Publication Data
US 2011/0308956 A1 Dec. 22, 2011

Related U.S. Application Data

(60) Provisional application No. 61/355,914, filed on Jun. 17, 2010.

(51) Int. Cl.
| | |
|---|---|
| C25D 5/02 | (2006.01) |
| H05K 3/00 | (2006.01) |
| C25D 5/48 | (2006.01) |
| C23C 18/16 | (2006.01) |
| C25D 5/10 | (2006.01) |
| C25D 5/12 | (2006.01) |
| H05K 3/24 | (2006.01) |
| H05K 3/10 | (2006.01) |

(52) U.S. Cl.
CPC ............ *C25D 5/48* (2013.01); *C23C 18/1653* (2013.01); *C25D 5/022* (2013.01); *C25D 5/10* (2013.01); *C25D 5/12* (2013.01); *H05K 3/108* (2013.01); *H05K 3/244* (2013.01)

(58) Field of Classification Search
USPC .................. 205/125, 126, 181, 191, 266, 300
See application file for complete search history.

(56) References Cited

U.S. PATENT DOCUMENTS

| | | | |
|---|---|---|---|
| 4,769,309 A | | 9/1988 | King et al. |
| 6,036,836 A | * | 3/2000 | Peeters et al. .................. 205/125 |
| 6,117,300 A | * | 9/2000 | Carbin et al. .................. 205/125 |
| 6,398,935 B1 | * | 6/2002 | Downes .......................... 205/81 |

(Continued)

OTHER PUBLICATIONS

International Search Report mailed Oct. 25, 2011, for corresponding International Patent Application No. PCT/US2011/040752, listing the cited references, 3 pages.

(Continued)

*Primary Examiner* — Luan Van
*Assistant Examiner* — Louis Rufo
(74) *Attorney, Agent, or Firm* — Polsinelli PC

(57) ABSTRACT

Systems and methods for reducing overhang on electroplated surfaces of printed circuit boards are described. One such method includes applying a first resist layer on a substrate having a first copper layer, applying a first image to the first resist layer, developing the first resist layer in accordance with the first image, applying a second copper layer on the first copper layer, electroplating a first metallic layer on the second copper layer, removing the first resist layer, etching a portion of the first copper layer, removing the first metallic layer, depositing a third copper layer on a surface of the assembly, applying a second resist layer on the third copper layer, applying a second image to the second resist layer, developing the second resist layer in accordance with the second image, electroplating a preselected metal layer on the third copper layer, removing the second resist layer, and etching a portion of the third copper layer.

15 Claims, 6 Drawing Sheets

(56) References Cited

U.S. PATENT DOCUMENTS

| | | | |
|---|---|---|---|
| 6,670,271 B1 * | 12/2003 | Subramanian et al. | 438/687 |
| 7,550,375 B2 * | 6/2009 | Wang et al. | 438/613 |
| 2009/0091028 A1 * | 4/2009 | Lin et al. | 257/737 |
| 2009/0236137 A1 | 9/2009 | Kaneda et al. | |
| 2010/0129754 A1 | 5/2010 | Cheetham et al. | |

OTHER PUBLICATIONS

Written Opinion of the International Searching Authority mailed Oct. 25, 2011, for corresponding International Patent Application No. PCT/US2011/040752, 5 pages.

* cited by examiner

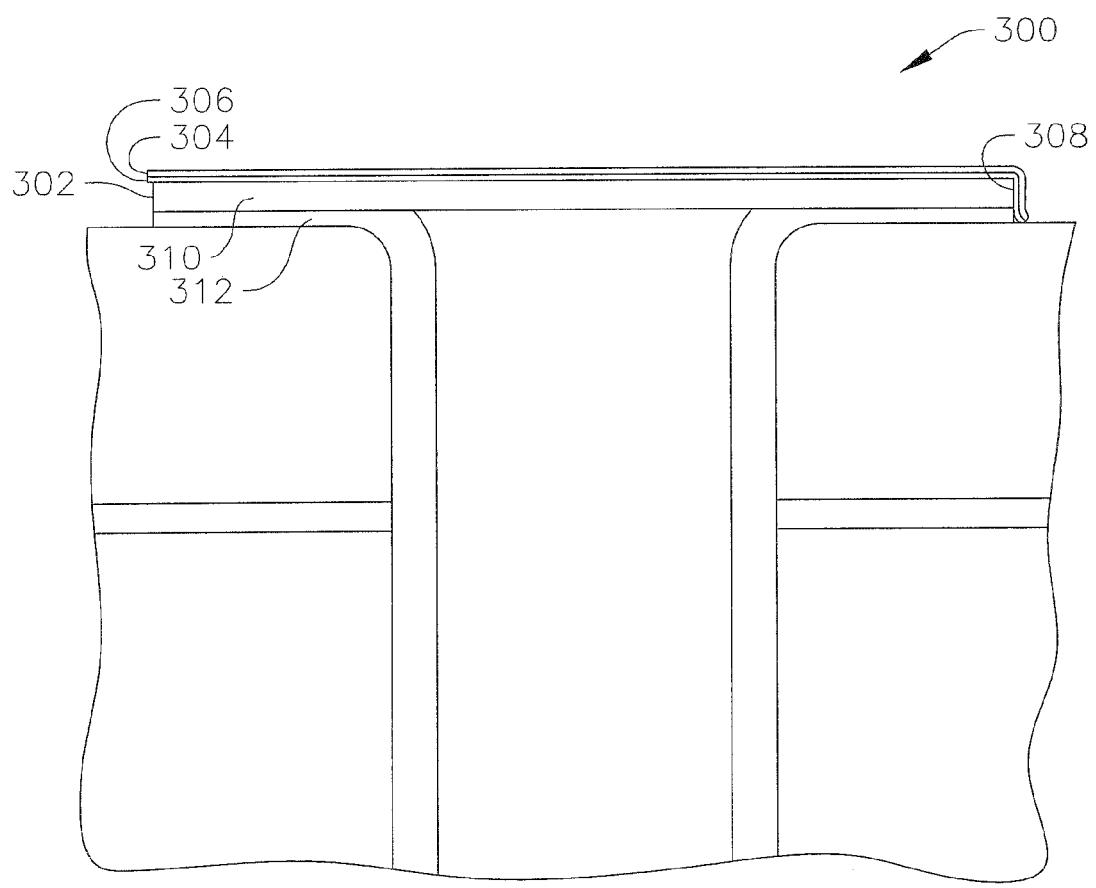

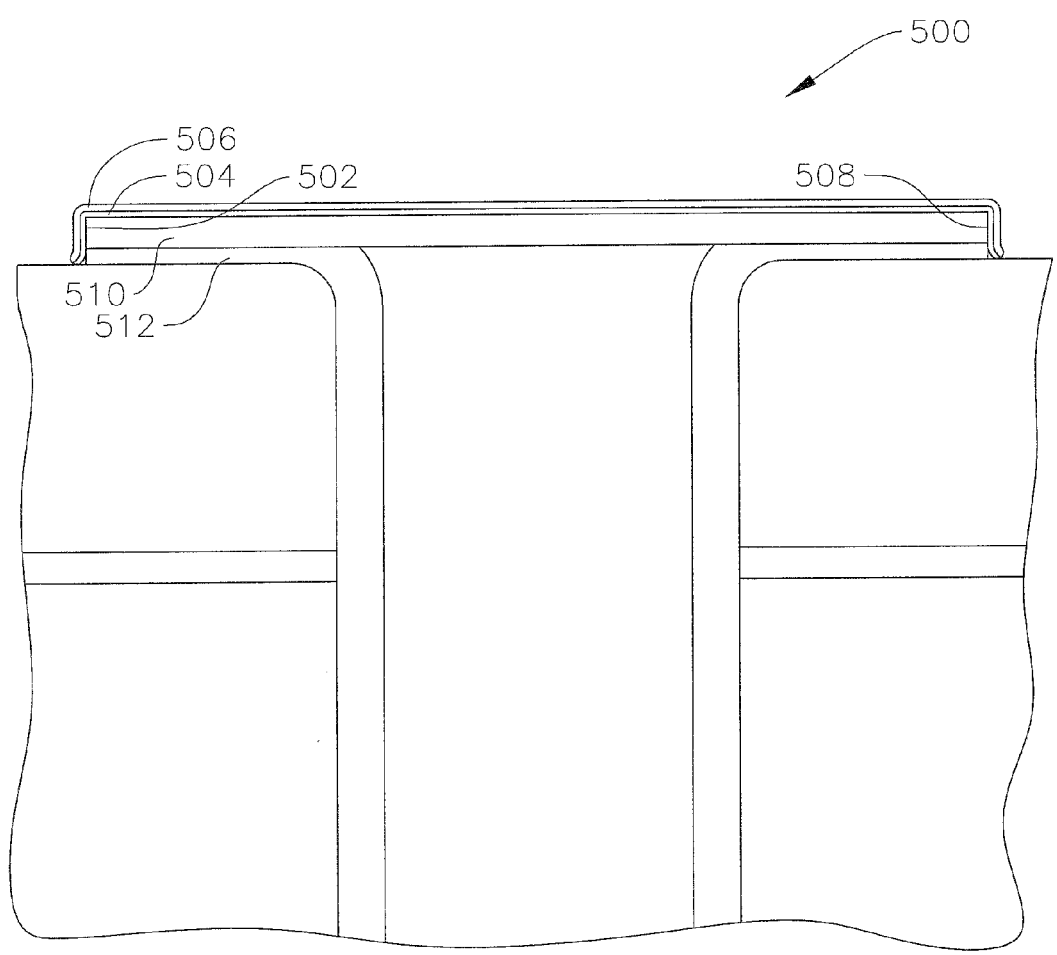

SYSTEMS AND METHODS FOR REDUCING OVERHANG ON ELECTROPLATED SURFACES OF PRINTED CIRCUIT BOARDS

CROSS-REFERENCE TO RELATED APPLICATION(S)

The present application claims priority to and the benefit of Provisional Application No. 61/355,914, filed Jun. 17, 2010, entitled "SYSTEMS AND METHODS FOR REDUCING OVERHANG ON ELECTROPLATED SURFACES OF PRINTED CIRCUIT BOARDS", the entire content of which is incorporated herein by reference.

FIELD OF THE INVENTION

The present invention relates generally to systems and methods for manufacturing printed circuit boards, and more particularly, to systems and methods for reducing overhang on electroplated surfaces of printed circuit boards.

BACKGROUND

Most electronic systems include printed circuit boards with high density electronic interconnections. A printed circuit board (PCB) may include one or more circuit cores, substrates, or carriers. In one fabrication scheme for the printed circuit board electronic surface features (e.g., pads, electronic interconnects, etc.) are fabricated onto opposite sides of an individual circuit carrier to form a pair of circuit layers.

In some applications, printed circuit boards can require gold or other metallic plating on particular surface features (e.g., pads, electronic interconnects, edge connectors, surface mount pads, and the like). In such case, the conventional processes for gold plating can require that the gold plating be done before etching the final image. Such conventional processes can use a two layer plating of nickel/gold acting as an etch resist or mask to prevent the surface features under the nickel/gold from being etched. However, during the conventional etching process, the edges of the surface features are exposed to the etching solution, and lateral etching occurs while the undesired surface copper is being etched. This lateral etching creates an undesired condition called "overhang" around the surface features. FIG. 1 illustrates a conventional gold plating process for plating a surface feature that results in an overhang.

SUMMARY

Aspects of the invention relate to systems and methods for reducing overhang on electroplated surfaces of printed circuit boards. In one embodiment, the invention relates to a method for manufacturing a printed circuit board assembly including applying a first resist layer on at least one part of a substrate having a first copper layer formed on a first surface of the substrate, applying a first image to at least one part of the first resist layer, developing the first resist layer in accordance with the first image, applying a second copper layer on the first copper layer, electroplating a first metallic layer on at least a portion of the second copper layer, removing the first resist layer, etching at least a portion of the first copper layer, removing the first metallic layer, depositing a third copper layer on a surface of the printed circuit board assembly, applying a second resist layer on the third copper layer, applying a second image to at least one part of the second resist layer, developing the second resist layer in accordance with the second image, electroplating a preselected metal layer on at least a portion of the third copper layer, removing the second resist layer, and etching at least a portion of the third copper layer.

BRIEF DESCRIPTION OF THE DRAWINGS

FIG. 3 illustrates a surface feature with reduced overhang at a first side wall and wrapped encapsulation layers at a second side wall in accordance with one embodiment of the invention.

FIG. 5 illustrates a surface feature with wrapped encapsulation layers at a first side wall and a second side wall in accordance with one embodiment of the invention.

DETAILED DESCRIPTION

Figure 1:
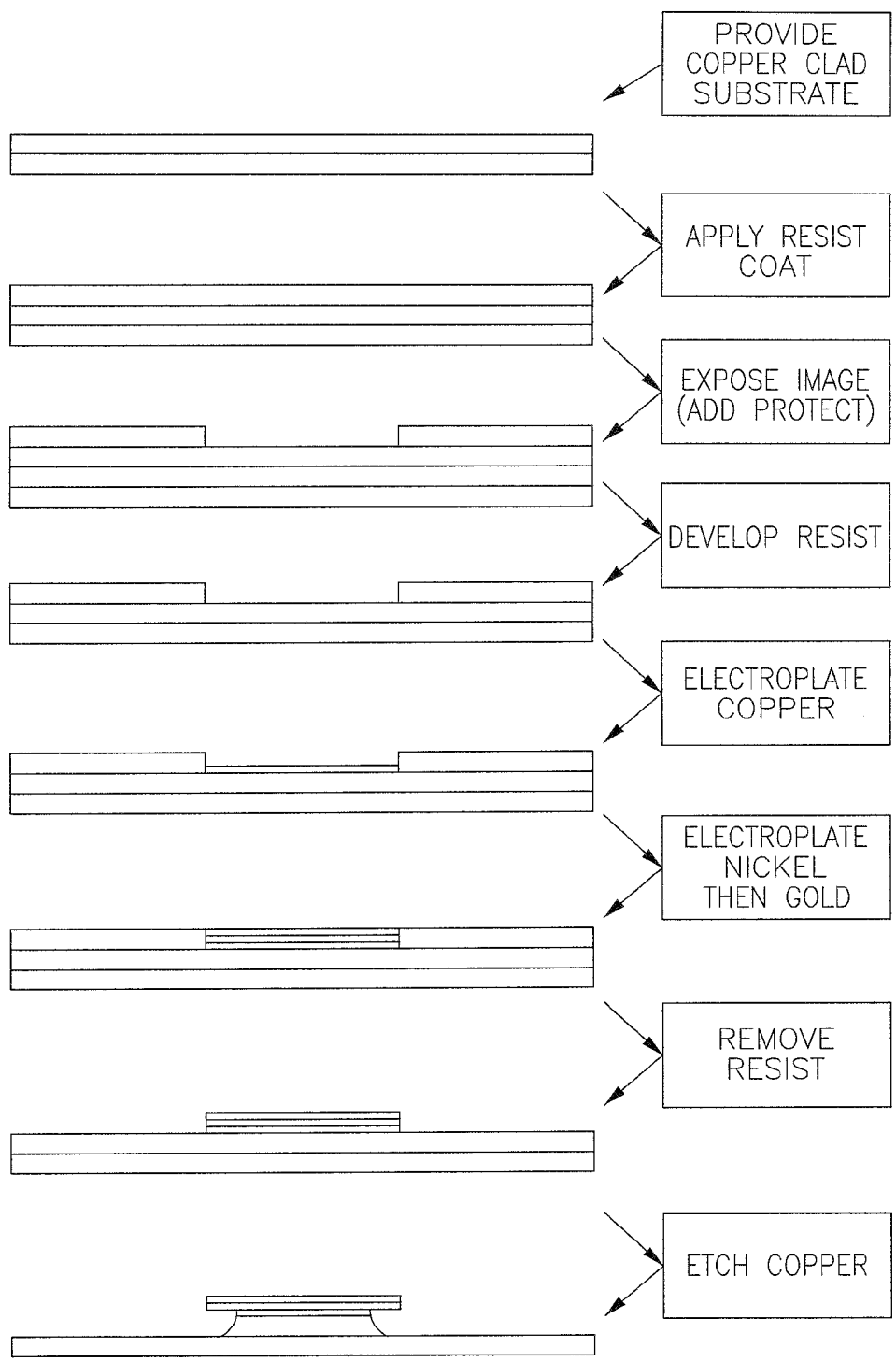
FIG. 1 illustrates a conventional gold plating process for plating a surface feature that results in an overhang.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. There may be parts shown in the drawings, or parts not shown in the drawings, that are not discussed in the specification as they are not essential to a complete understanding of the invention. Like reference numerals designate like elements.

Figure 2A:
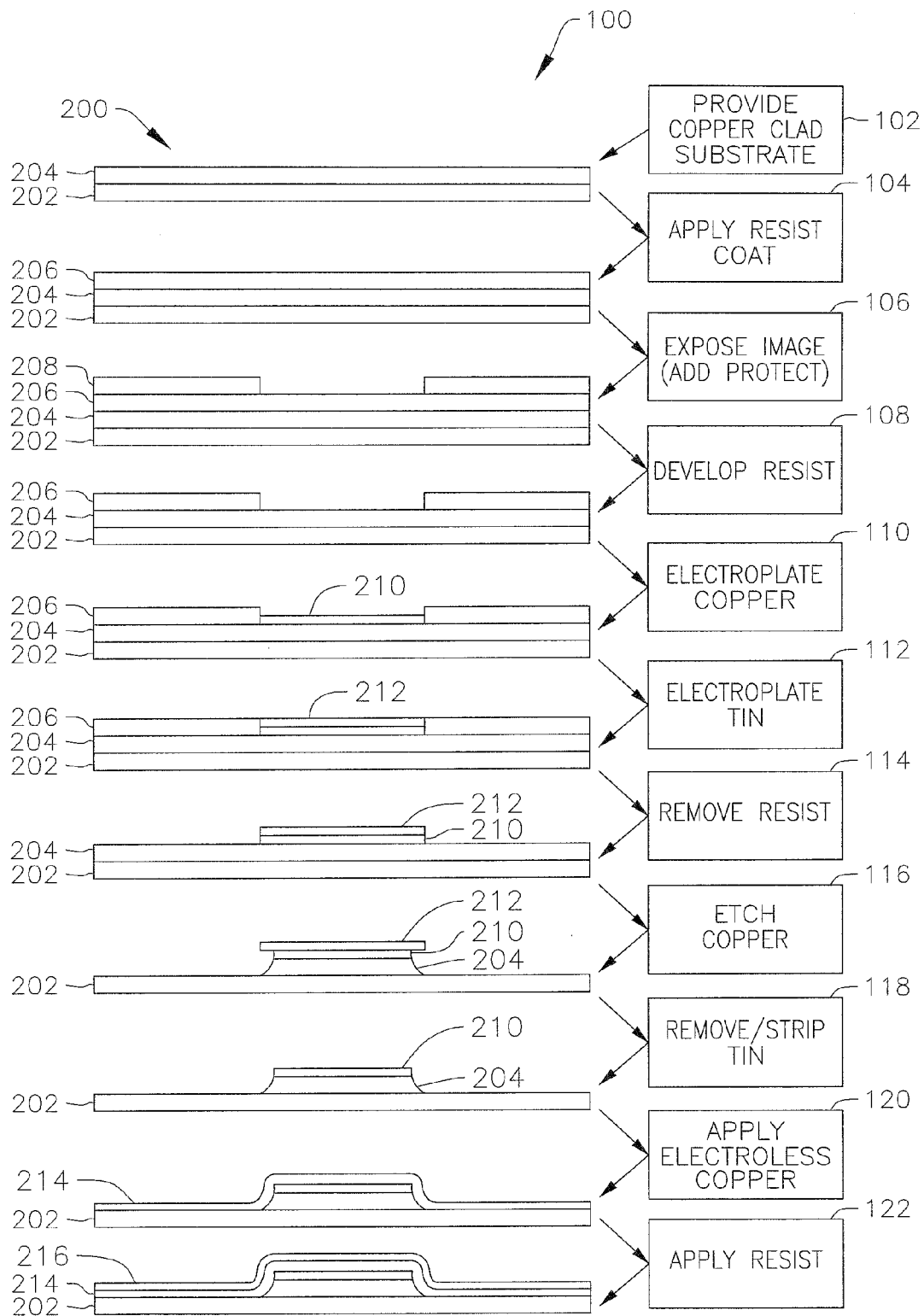
FIGS. 2a-2b illustrate a gold plating process for plating a surface feature with reduced overhang in accordance with one embodiment of the invention.
Figure 2B:
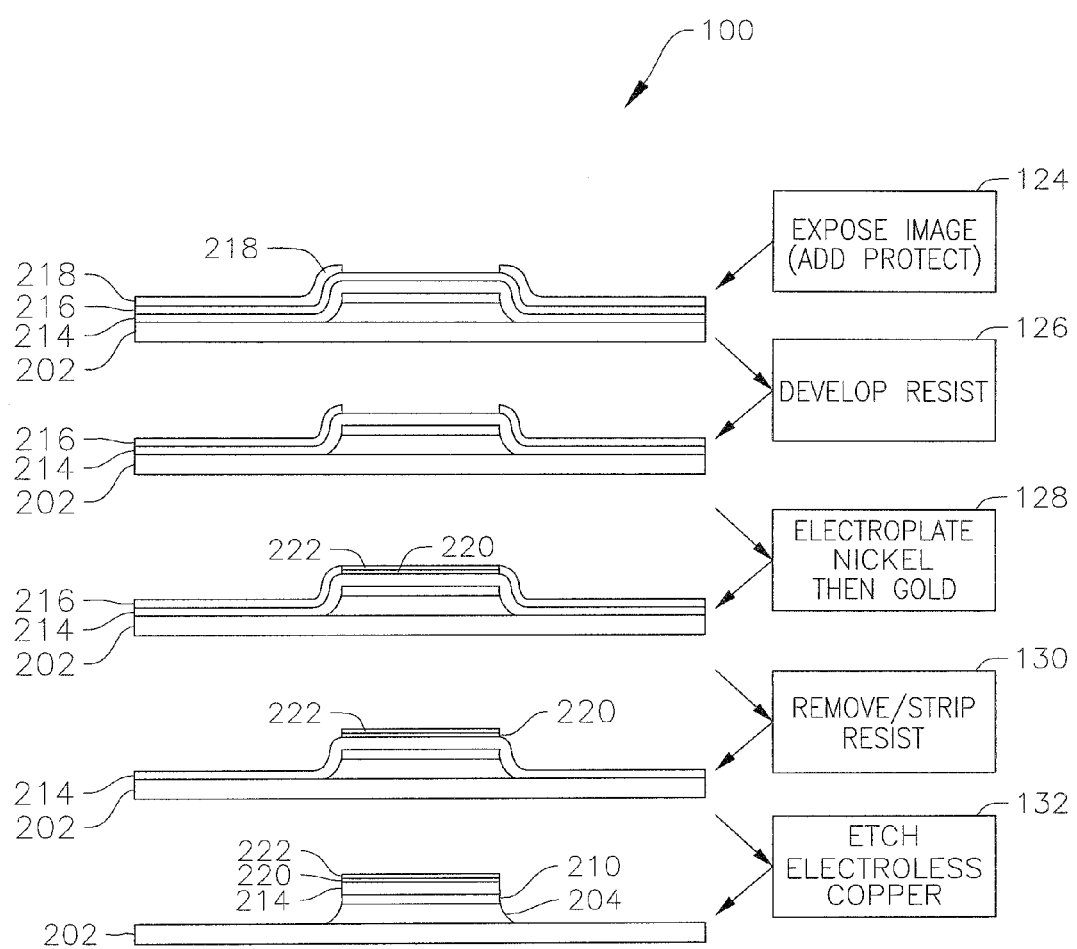

FIGS. 2a-2b illustrate a gold plating process 100 for plating a surface feature with reduced overhang in accordance with one embodiment of the invention. The process 100 begins by providing (102) an assembly 200 including a substrate 202 with copper cladding (e.g., base layer of copper) 204 on one surface of the substrate 202. In other embodiments, copper cladding is provided on two surfaces of the substrate. In one embodiment, the base copper layer 204 has a thickness of 0.5 mils (or of about 0.5 mils) corresponding to a weight of 0.375 ounces (or of about 0.375 ounces), 0.7 mils (or of about 0.7 mils) corresponding to a weight of approximately 0.5 ounces (or of about 0.5 ounces), or 1.4 mils (or of about 1.4 mils) corresponding to a weight of approximately 1 ounce (or of about 1 ounce).

The process then applies (104) a resist coat/layer 206 on a top surface of the base copper layer 204. In one embodiment, the resist layer 206 can be a liquid photoresist, a dry film resist, a positive photoresist, a negative photoresist, and/or another suitable resist. The process exposes (106) an image 208 on the resist layer 208 to protect preselected areas from subsequent resist removal. The process then develops/removes (108) the resist from those areas that were not exposed during the exposure process. The process then electroplates (110) a copper layer 210 (e.g., plated copper layer or relatively thin copper layer) onto the conductive areas no longer protected by the resist. The process then electroplates (112) a tin layer 212. The tin layer 212 is used as a mask to prevent unwanted etching of the base copper layer 204. In other embodiments, other suitable materials can be used as a mask to prevent unwanted etching. For example, tin/lead or solder electroplating can also be used to mask unwanted etching.

The process then removes (114) the resist from those surface areas having the resist that were not previously developed in block 108. The process etches (116) the base layer copper 204 from areas of the assembly not masked by the tin layer 212. In several embodiments, the process can etch the substrate assembly with a solution or etching process designed to remove copper at a thickness of 0.7 mils (or of about 0.7 mils). The process then strips/removes (118) the tin layer 212 from the assembly. The process then applies (120) a layer of electroless copper 214 to outer surfaces of the assembly. In some embodiments, the process applies the layer of electroless copper 214 at a thickness of 0.05 mils (or of about 0.05 mils). In other embodiments, process applies the layer of electroless copper 214 at other suitable thicknesses. In several embodiments, the process applies the layer of electroless copper 214 using chemical or physical deposition, electroless deposition, sputter deposition, spray coating deposition, chemical vapor deposition and/or another suitable deposition process.

The process then applies (122) a second resist layer 216 to outer surfaces of the assembly (e.g., an outer surface of the electroless copper 214). In several embodiments, the process deposits the second resist layer 216 using a chemical or physical deposition process. In one such embodiment, the process deposits the second resist layer using a liquid deposition process. In another embodiment, the process deposits the second resist layer using a deposition process in a vacuum chamber. In another embodiment, the process deposits the second resist layer using an ink jet process, a screen print process, a spray coat process, a roller coat process, a dip coat process, a roll laminate process, an electroplating process, and/or another suitable deposition process.

The process then exposes/prints (124) a second image 218 on the second resist layer 216 to protect the imaged areas from subsequent resist removal. In several embodiments, the lateral width (e.g., length) of the second image 218 can be substantially similar (e.g., about equal) to the lateral width of the first image 208. In one embodiment, the lateral width of the second image 218 is equal to lateral width of the first image 208. In some embodiments, the lateral width of the second image 218 is slightly larger than the lateral width of the first image 208. In some embodiments, the lateral width of the second image 218 is slightly smaller than the lateral width of the first image 208. In some embodiments, the first image 208 and second image 218 are adjusted based on an iterative trial and error process. In several embodiments, the position of the second image 218 is adjusted to be aligned with the location of the first image. In one embodiment, the alignment is imperfect and some minor mis-alignment or mis-registration is present.

The process then develops/removes (126) the second resist layer 216 from those areas that were not protected during the exposure process. The process then electroplates (128) a nickel layer 220 onto the conductive areas no longer protected by the resist (e.g., on exposed areas of third copper layer 214). In one embodiment, the process electroplates the nickel layer 220 with a thickness of 0.2 to 0.3 mils (or of about 0.2 to 0.3 mils). In other embodiments, the nickel layer can have other suitable thicknesses. The process then electroplates (128) a gold layer 222 onto the conductive areas no longer protected by the resist (e.g., on the nickel layer 220). In one embodiment, the process electroplates the gold layer 222 with a thickness of 0.02 to 0.1 mils (or of about 0.02 to 0.1 mils). In other embodiments, the gold layer can have other suitable thicknesses.

The process then removes/strips (130) the second resist 216 from those surface areas having the second resist that were not previously developed. The process then etches (132) the copper on the substrate assembly including areas of the electroless copper layer 214 not masked by the nickel layer 220 and the gold layer 222. In several embodiments, the process can etch the substrate assembly with a solution or etching process designed to remove copper at a thickness of 0.05 mils (or of about 0.05 mils). In other embodiments, the process can etch the substrate assembly with a solution or etching process designed to remove copper at a suitable thickness of less than or greater than 0.05 mils. In one embodiment, the process performs the final etching 132 using a quick/flash etching process. In one embodiment, the process performs the final etching 132 using an ammoniacal etch, a persulfate etch, a sulfuric peroxide etch, and/or another suitable copper etching solution.

The product of the process or remaining layer structures can form surface features such as pads that have substantially reduced overhang. The surface features produced can include full or partial encapsulation by way of the nickel/gold layers. The surface features produced can provide increased contact area under the nickel/gold plating for improved bonding.

In some embodiments, the process does not perform all of the actions described. In other embodiments, the process performs additional actions. In one embodiment, the process performs the actions in a different order than illustrated. In some embodiments, the process performs some of the actions simultaneously.

In the process illustrated in FIGS. 2a-2b, the process etches (116) the base layer copper 204 from areas of the assembly not masked by the tin layer 212. In other embodiments, the process partially etches (116) the base layer copper 204. In such case, a thin layer of the base copper can remain on the top surface of the substrate 202. In one embodiment, the partial etching allows the process to avoid applying (120) electroless copper. In another embodiment, process still applies (120) the electroless copper despite having partially etched (116) the base copper 204.

In the process illustrated in FIGS. 2a-2b, the process applies nickel and gold layers to encapsulate surface features of a PCB. In other embodiments, the process can apply other suitable layers to the surface features of a PCB. In one such embodiment, the additional suitable layers are metal layers.

In the process illustrated in FIGS. 2a-2b, the process develops/removes (126) the second resist layer 216 from those areas that were not protected during the exposure process (124). In some embodiments, the process additionally sands a top surface of those areas that were not protected during the exposure process (124). In such case, the sanding can remove undesirable portions of the second resist layer 216 that exist due to mis-registration of the second image 218 with respect to the first image 208.

In one embodiment, the second resist 216 can be liquid resist or liquid photoimageable (LPI) solder mask. In some embodiments, the electroless copper can be flash/quick etched using ammonia etch solution, ammonia etch replenisher or commonly used micro-etch solutions known in the industry, including, without limitation, per-sulfate-sulfuric acid solution, hydrogen peroxide-sulfuric acid solution and other suitable solutions.

In some cases, after coating the first image 208 with second resist 216, instead of second image print (124), the first image is exposed by sanding the protruding surface. In this way, the top surface of the entire image is exposed while the sides of all features are still covered with second resist 216 (see e.g., assembly 200 of FIG. 2b after block 126). In other embodiments, other alternative methods of performing the actions of FIGS. 2a and 2b known to those skilled in the art may also be used.

FIG. 3 illustrates a surface feature 300 with reduced overhang at a first side wall 302 and wrapped encapsulation layers (304, 306) at a second side wall 308 in accordance with one embodiment of the invention. In the embodiment of FIG. 3, the surface feature 300 is a pad positioned on a through hole via. The pad includes an outer layer of gold 306 on a layer of nickel 304 on a plated copper layer 310. The pad is positioned on a second copper layer 312 associated with the via. In some embodiments, the surface feature 300 can be manufactured using the process 100 described in FIGS. 2a-2b. In several embodiments, the wrapped portion of the encapsulation layers at the second side wall 308 is unintentional. In one embodiment, the wrapped portion can result when the image (e.g., second image) used in the second imaging step 124 of process 100 is not accurately aligned (e.g., mis-registration) with the image (e.g., first image) used in the first imaging step 106 (e.g., the base layers (204, 210) of the surface feature being formed in the process 100 of FIGS. 2a-2b).

Figure 4:
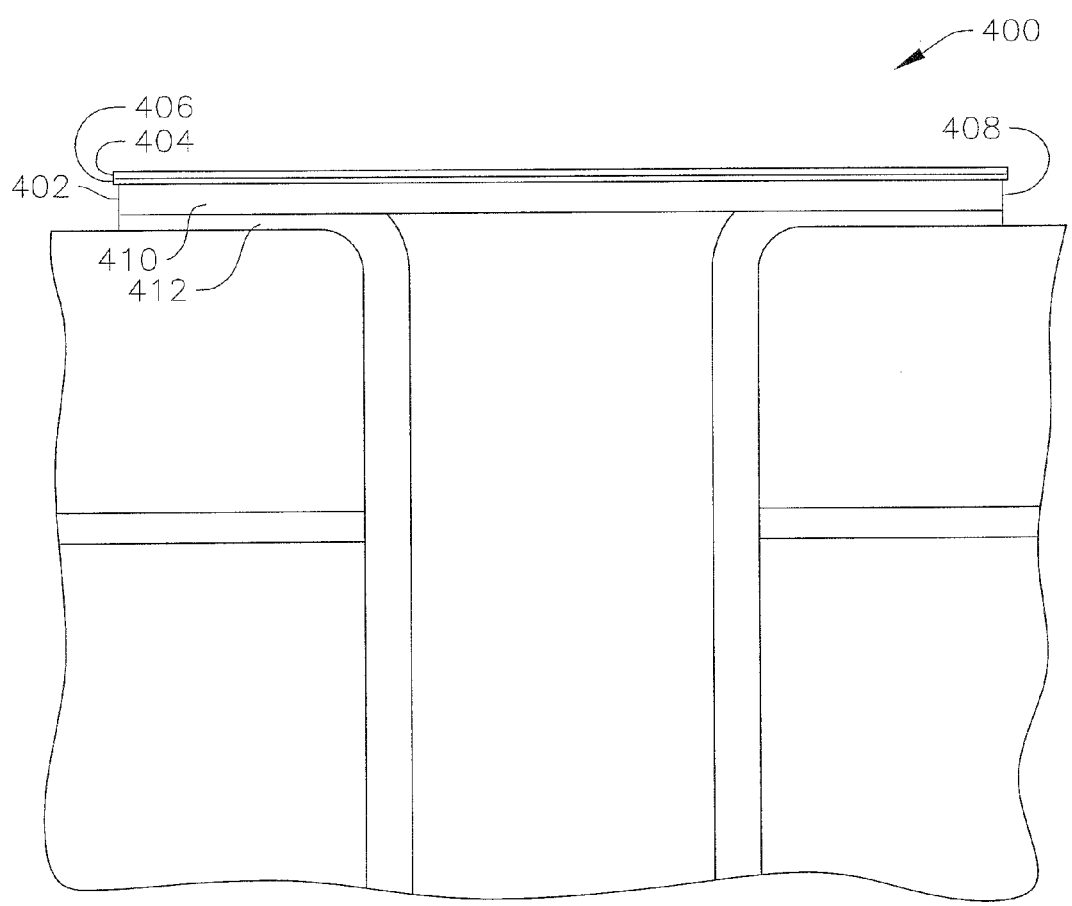
FIG. 4 illustrates a surface feature with reduced overhang at a first side wall and a second side wall in accordance with one embodiment of the invention.

FIG. 4 illustrates a surface feature 400 with reduced overhang at a first side wall 402 and a second side wall 408 in accordance with one embodiment of the invention. The surface feature 400 is a pad positioned on a through hole via. The pad includes an outer layer of gold 406 on a layer of nickel 404 on a plated copper layer 410. The pad is positioned on a second copper layer 412 associated with the via. In some embodiments, the surface feature 400 can be manufactured using the process described in FIGS. 2a-2b. In several embodiments, the reduced overhang on both side walls (402, 408) can be a result of making the lateral width of the second image about equal to, or slightly smaller than, the lateral width of the first image, and proper alignment of the second image during the second imaging step 124.

FIG. 5 illustrates a surface feature 500 with wrapped encapsulation layers (504, 506) at a first side wall 502 and a second side wall 508 in accordance with one embodiment of the invention. The surface feature 500 is a pad positioned on a through hole via. The pad includes an outer layer of gold 506 on a layer of nickel 504 on a plated copper layer 510. The pad is positioned on a second copper layer 512 associated with the via. In some embodiments, the surface feature 500 can be manufactured using the process described in FIGS. 2a-2b. In several embodiments, the wrapped encapsulation layers on both side walls (502, 508) can be a result of making the lateral width of the second image greater than the lateral width of the first image.

As compared to the resulting surface feature illustrated at the end of the conventional process of FIG. 1, the surface features 300, 400, and 500 of FIG. 3, FIG. 4, and FIG. 5, respectively, have substantially reduced or even negligible overhang.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A method for manufacturing a printed circuit board assembly, the method comprising:
   applying a first resist layer on at least one part of a substrate having a first copper layer formed on a first surface of the substrate;
   applying a first image to at least one part of the first resist layer;
   developing the first resist layer in accordance with the first image;
   applying a second copper layer on a surface of the first copper layer;
   electroplating a first metallic layer on at least a portion of a surface of the second copper layer;
   removing the first resist layer;
   etching at least a portion of the first copper layer;
   removing the first metallic layer;
   depositing a third copper layer that contacts and covers at least a portion of the second copper layer, at least a portion of the first copper layer, and at least as portion of the substrate of the printed circuit board assembly;
   applying a second resist layer on the third copper layer;
   applying a second image to at least one part of the second resist layer;
   developing the second resist layer in accordance with the second image;
   electroplating a preselected metal layer on at least a portion of the third copper layer;
   removing the second resist layer; and
   etching the third copper layer from at least a portion of the second copper layer not covered by the preselected metal layer, the at least a portion of the first copper layer, and the at least portion of the substrate.

2. The method of claim 1, wherein the electroplating the preselected metal layer on the at least the portion of the third copper layer comprises:
   electroplating a nickel layer on at least a portion of the third copper layer; and
   electroplating a gold layer on the nickel layer.

3. The method of claim 1, wherein the first metallic layer comprises tin.

4. The method of claim 1, wherein the first metallic layer comprises tin and lead.

5. The method of claim 1, wherein the applying the second image to the at least one part of the second resist layer comprises aligning the second image along the second resist layer in accordance with a location of the first image.

6. The method of claim 5, wherein the aligning the second image along the second resist layer in accordance with the location of the first image comprises at least some mis-alignment between a location of the second image and the location of the first image.

7. The method of claim 1, wherein a width of the second image is less than a width of the first image.

8. The method of claim 1, wherein a width of the second image is greater than a width of the first image.

9. The method of claim 1, wherein the developing the second resist layer in accordance with the second image comprises sanding the second resist layer in accordance with the second image.

10. The method of claim 1, wherein the first resist layer comprises a resist selected from the group consisting of a liquid photoresist, a dry film resist, a positive photoresist, and a negative photoresist.

11. The method of claim 1, wherein the applying a second resist layer on the third copper layer comprises using a process selected from the group consisting of an ink jet process, a screen print process, a spray coat process, a roller coat process, a dip coat process, a roll laminate process, and an electroplating process.

12. The method of claim 1, wherein the electroplating the preselected metal layer on the at least a portion of the third copper layer comprises wrapping at least a portion of the preselected metal layer along a side wall formed by the first copper layer and the second copper layer.

13. The method of claim 1, wherein the etching the at least the portion of the third copper layer comprises using a copper etching solution selected from the group consisting of ammoniacal etch, persulfate etch, and sulfuric peroxide etch.

14. The method of claim 1, wherein the depositing the third copper layer on the surface of the printed circuit board assembly comprises using a deposition process selected from the group consisting of electroless deposition, sputter deposition, spray coating deposition, and chemical vapor deposition.

15. The method of claim 1, wherein a width of the second image is about equal to a width of the first image.

* * * * *